United States Patent
Aida et al.

(10) Patent No.: US 11,495,726 B2
(45) Date of Patent: Nov. 8, 2022

(54) PIEZOELECTRIC ELEMENT, AND RESONATOR USING PIEZOELECTRIC ELEMENT

(71) Applicant: Murata Manufacturing Co., Ltd., Nagaokakyo (JP)

(72) Inventors: Yasuhiro Aida, Nagaokakyo (JP); Daiki Murauchi, Nagaokakyo (JP)

(73) Assignee: MURATA MANUFACTURING CO, LTD., Nagaokakyo (JP)

( * ) Notice: Subject to any disclaimer, the term of this patent is extended or adjusted under 35 U.S.C. 154(b) by 840 days.

(21) Appl. No.: 16/419,219

(22) Filed: May 22, 2019

(65) Prior Publication Data

US 2019/0280181 A1 Sep. 12, 2019

Related U.S. Application Data

(63) Continuation of application No. PCT/JP2017/044319, filed on Dec. 11, 2017.

(30) Foreign Application Priority Data

Jan. 19, 2017 (JP) .............................. JP2017-007380

(51) Int. Cl.
*H01L 41/047* (2006.01)
*H01L 41/08* (2006.01)
(Continued)

(52) U.S. Cl.
CPC .......... *H01L 41/047* (2013.01); *H01L 41/083* (2013.01); *H01L 41/0805* (2013.01);
(Continued)

(58) Field of Classification Search
CPC .. H01L 41/047; H01L 41/083; H01L 41/0805
See application file for complete search history.

(56) References Cited

U.S. PATENT DOCUMENTS

| 7,758,979 | B2 | 7/2010 | Akiyama et al. |
| 9,246,079 | B2 | 1/2016 | Umeda et al. |
| (Continued) | | | |

FOREIGN PATENT DOCUMENTS

| JP | 2009010926 A | 1/2009 |
| JP | 2013128267 A | 6/2013 |
| (Continued) | | |

OTHER PUBLICATIONS

International Search Report issued in PCT/JP2017/044319, dated Jan. 23, 2018.

(Continued)

*Primary Examiner* — J. San Martin
(74) *Attorney, Agent, or Firm* — ArentFox Schiff LLP

(57) ABSTRACT

A piezoelectric element that includes a substrate, a lower electrode layer on the substrate, an intermediate layer on the lower electrode layer, and an upper electrode layer on the intermediate layer. The intermediate layer includes a first piezoelectric layer including an aluminum nitride as a main component thereof and located between the lower electrode layer and the upper electrode layer, a first buffer layer including an aluminum nitride as a main component and located between the first piezoelectric layer and the upper electrode layer, a first intermediate electrode layer located between the first buffer layer and the upper electrode layer, and a second piezoelectric layer located between the first intermediate electrode layer and the upper electrode layer.

20 Claims, 5 Drawing Sheets

(51) Int. Cl.
*H01L 41/083* (2006.01)
*H01L 41/187* (2006.01)
*H01L 41/09* (2006.01)
*H01L 41/113* (2006.01)

(52) U.S. Cl.
CPC ............ *H01L 41/09* (2013.01); *H01L 41/113* (2013.01); *H01L 41/187* (2013.01)

(56) References Cited

U.S. PATENT DOCUMENTS

| | | |
|---|---|---|
| 9,831,851 B2 | 11/2017 | Moulard et al. |
| 10,079,334 B2 | 9/2018 | Moulard et al. |
| 2005/0168104 A1* | 8/2005 | Bouche ................. H03H 9/564 310/324 |
| 2008/0296529 A1 | 12/2008 | Akiyama et al. |
| 2013/0127300 A1 | 5/2013 | Umeda et al. |
| 2015/0333248 A1 | 11/2015 | Moulard |
| 2015/0333249 A1 | 11/2015 | Moulard et al. |
| 2015/0357401 A1* | 12/2015 | Pelloquin ................ H01L 28/60 257/532 |
| 2016/0035959 A1* | 2/2016 | Mayer ..................... H01L 41/04 257/415 |
| 2016/0372653 A1* | 12/2016 | Umeda ................... C23C 14/14 |
| 2019/0006574 A1* | 1/2019 | Mardilovich ....... H01L 41/0805 |
| 2021/0057634 A1* | 2/2021 | Kishimoto ............ H01L 41/083 |

FOREIGN PATENT DOCUMENTS

| | | |
|---|---|---|
| JP | 2013201346 A | 10/2013 |
| JP | 2016502363 A | 1/2016 |
| JP | 2016504870 A | 2/2016 |

OTHER PUBLICATIONS

Written Opinion of the International Searching Authority issued in PCT/JP2017/044319, dated Jan. 23, 2018.

* cited by examiner

FIG. 3

| | UPPER ELECTRODE LAYER | UPPER PIEZOELECTRIC LAYER | INTERMEDIATE ELECTRODE LAYER | INTERMEDIATE BUFFER LAYER | | LOWER PIEZOELECTRIC LAYER | | LOWER ELECTRODE LAYER | SUBSTRATE | INTERMEDIATE BUFFER LAYER FILM THICKNESS/LOWER PIEZOELECTRIC LAYER FILM THICKNESS RATIO | WHEN FORMING INTERMEDIATE BUFFER LAYER pulse DC power kW | Ar ETCHING TREATMENT BEFORE FORMING INTERMEDIATE BUFFER LAYER | PRESENCE OF OXYGEN BETWEEN INTERMEDIATE BUFFER LAYER AND LOWER PIEZOELECTRIC LAYER |
|---|---|---|---|---|---|---|---|---|---|---|---|---|---|
| | | | | MATERIAL | FILM THICKNESS (nm) | MATERIAL | FILM THICKNESS (nm) | | | | | | |
| COMPARATIVE EXAMPLE 1 | Ru 100nm | MgNbAlN 800nm | Ru 100nm | NONE | 0 | MgNbAlN | 800 | Ru 100nm/Ti 10nm | Si | 0.0% | 1.5kW | NONE | YES |
| EXAMPLE 1 | Ru 100nm | MgNbAlN 800nm | Ru 100nm | AlN | 2 | MgNbAlN | 800 | Ru 100nm/Ti 10nm | Si | 0.3% | 1.5kW | NONE | YES |
| COMPARATIVE EXAMPLE 2 | Ru 100nm | ScAlN 800nm | Ru 100nm | NONE | 0 | ScAlN | 800 | Ru 100nm/Ti 10nm | Si | 0.0% | 1.5kW | NONE | YES |
| EXAMPLE 2 | Ru 100nm | ScAlN 800nm | Ru 100nm | AlN | 2 | ScAlN | 800 | Ru 100nm/Ti 10nm | Si | 0.3% | 1.5kW | NONE | YES |
| EXAMPLE 3 | Mo 100nm | ScAlN 800nm | Mo 100nm | AlN | 2 | ScAlN | 800 | Mo 100nm/Ti 10nm | Si | 0.3% | 1.5kW | NONE | YES |
| EXAMPLE 4 | Mo 100nm | ScAlN 800nm | Mo 100nm | AlN | 5 | ScAlN | 800 | Mo 100nm/Ti 10nm | Si | 0.6% | 1.5kW | NONE | YES |
| EXAMPLE 5 | Mo 100nm | ScAlN 800nm | Mo 100nm | AlN | 10 | ScAlN | 800 | Mo 100nm/Ti 10nm | Si | 1.3% | 1.5kW | NONE | YES |
| EXAMPLE 6 | Mo 100nm | ScAlN 800nm | Mo 100nm | AlN | 20 | ScAlN | 800 | Mo 100nm/Ti 10nm | Si | 2.5% | 1.5kW | NONE | YES |
| EXAMPLE 7 | Mo 100nm | ScAlN 800nm | Mo 100nm | AlN | 50 | ScAlN | 800 | Mo 100nm/Ti 10nm | Si | 6.3% | 1.5kW | NONE | YES |
| EXAMPLE 8 | Mo 100nm | ScAlN 800nm | Mo 100nm | AlN | 100 | ScAlN | 800 | Mo 100nm/Ti 10nm | Si | 12.5% | 1.5kW | NONE | YES |
| EXAMPLE 9 | Mo 100nm | ScAlN 800nm | Mo 100nm | AlN | 200 | ScAlN | 800 | Mo 100nm/Ti 10nm | Si | 25.0% | 1.5kW | NONE | YES |
| EXAMPLE 10 | Mo 100nm | ScAlN 800nm | Mo 100nm | AlN | 250 | ScAlN | 800 | Mo 100nm/Ti 10nm | Si | 31.3% | 1.5kW | NONE | YES |
| EXAMPLE 11 | Mo 100nm | ScAlN 800nm | Mo 100nm | AlN | 300 | ScAlN | 800 | Mo 100nm/Ti 10nm | Si | 37.5% | 1.5kW | NONE | YES |
| EXAMPLE 12 | Mo 100nm | ScAlN 800nm | Mo 100nm | AlN | 30 | ScAlN | 800 | Mo 100nm/Ti 10nm | Si | 3.8% | 1.5kW | NONE | YES |
| EXAMPLE 13 | Mo 100nm | ScAlN 800nm | Mo 100nm | AlN | 30 | ScAlN | 800 | Mo 100nm/Ti 10nm | Si | 3.8% | 1.0kW | NONE | YES |
| EXAMPLE 14 | Mo 100nm | ScAlN 800nm | Mo 100nm | AlN | 30 | ScAlN | 800 | Mo 100nm/Ti 10nm | Si | 3.8% | 0.5kW | NONE | YES |
| EXAMPLE 15 | Mo 100nm | ScAlN 800nm | Mo 100nm | AlN | 30 | ScAlN | 800 | Mo 100nm/Ti 10nm | Si | 3.8% | 0.2kW | NONE | YES |
| EXAMPLE 16 | Mo 100nm | ScAlN 800nm | Mo 100nm | AlN | 30 | ScAlN | 800 | Mo 100nm/Ti 10nm | Si | 3.8% | 0.1kW | NONE | YES |
| EXAMPLE 17 | Mo 100nm | ScAlN 800nm | Mo 100nm | AlN | 30 | ScAlN | 800 | Mo 100nm/Ti 10nm | Si | 3.8% | 0.1kW | YES | NONE |

FIG. 4

| | ARITHMETIC MEAN ROUGHNESS OF INTERMEDIATE BUFFER LAYER Ra nm | XRD INTENSITY cps | | | d33_f (pm/V) |
|---|---|---|---|---|---|
| | | UPPER PIEZOELECTRIC LAYER | LOWER PIEZOELECTRIC LAYER | INTERMEDIATE ELECTRODE | |
| COMPARATIVE EXAMPLE 1 | 7.2 | 0 | 8294 | 0 | 12.6 |
| EXAMPLE 1 | 6.8 | 5600 | 8412 | 5403 | 32.5 |
| COMPARATIVE EXAMPLE 2 | 6.3 | 0 | 12045 | 0 | 15.1 |
| EXAMPLE 2 | 5.9 | 6209 | 11999 | 6029 | 35.7 |
| EXAMPLE 3 | 4.3 | 7706 | 12119 | 7194 | 40.1 |
| EXAMPLE 4 | 4.5 | 8562 | 12005 | 7531 | 44.9 |
| EXAMPLE 5 | 4.8 | 9398 | 12010 | 8498 | 45.6 |
| EXAMPLE 6 | 4.7 | 10071 | 11999 | 11892 | 46.0 |
| EXAMPLE 7 | 4.8 | 10702 | 12140 | 13765 | 46.3 |
| EXAMPLE 8 | 5.1 | 11440 | 12153 | 14640 | 45.1 |
| EXAMPLE 9 | 5.3 | 11649 | 12023 | 16546 | 44.9 |
| EXAMPLE 10 | 5.4 | 12101 | 12301 | 17200 | 32.5 |
| EXAMPLE 11 | 5.6 | 12321 | 12003 | 18013 | 25.4 |
| EXAMPLE 12 | 4.5 | 10541 | 12228 | 12560 | 46.2 |
| EXAMPLE 13 | 2.6 | 11002 | 12340 | 12821 | 46.7 |
| EXAMPLE 14 | 1.8 | 13411 | 12183 | 18900 | 49.2 |
| EXAMPLE 15 | 1.0 | 15122 | 11981 | 21510 | 50.0 |
| EXAMPLE 16 | 0.9 | 15510 | 12054 | 22087 | 50.1 |
| EXAMPLE 17 | 0.9 | 17427 | 12051 | 25251 | 52.1 |

FIG. 5
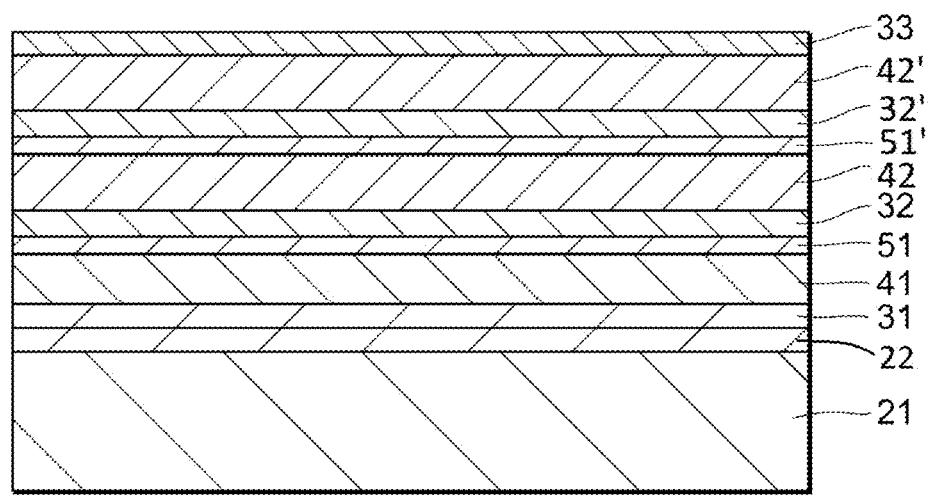
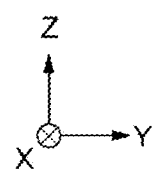

PIEZOELECTRIC ELEMENT, AND RESONATOR USING PIEZOELECTRIC ELEMENT

CROSS REFERENCE TO RELATED APPLICATIONS

The present application is a continuation of International application No. PCT/JP2017/044319, filed Dec. 11, 2017, which claims priority to Japanese Patent Application No. 2017-007380, filed Jan. 19, 2017, the entire contents of each of which are incorporated herein by reference.

FIELD OF THE INVENTION

The present invention relates to a piezoelectric element and a resonator using the piezoelectric element.

BACKGROUND OF THE INVENTION

A piezoelectric film comprised of an aluminum nitride (hereinafter also referred to as an "AlN piezoelectric film") has high heat resistance, and also has a good Q value and a frequency temperature coefficient characteristic. On the other hand, the AlN piezoelectric film has a low piezoelectric constant. Therefore, when the AlN piezoelectric film is used as a piezoelectric material for a MEMS device or the like, a higher operation voltage is required than when another piezoelectric material such as a lead zirconate titanate (PZT) is used.

Patent Document 1 discloses a technique for improving the piezoelectric constant of the AlN piezoelectric film. In Patent Document 1, the piezoelectric constant of the AlN piezoelectric film is improved by doping an appropriate amount of scandium to the AlN piezoelectric film to change the crystal structure of AlN.

Patent Document 1: Japanese Patent Application Laid-Open No. 2009-10926

SUMMARY OF THE INVENTION

Meanwhile, it is known that in a sensor, an actuator, or the like using a piezoelectric film, by employing a multi-morph structure having two or more piezoelectric film layers with an electrode layer interposed therebetween, sensitivity and driving force are improved. However, in an ScAlN piezoelectric film described in Patent Document 1, doping of scandium causes the AlN crystal structure to be distorted or the surface thereof to become rough. When a multi-morph structure is formed by using a plurality of ScAlN piezoelectric films having such crystal structure distortion or surface roughness, crystallinity of an electrode layer on a lower ScAlN and an upper ScAlN layer deteriorates. Therefore, even if two or more piezoelectric layers are provided, crystallinity and piezoelectricity of the second and subsequent piezoelectric layers are deteriorated, and there is a room for improvement from the viewpoint of improving sensitivity and driving force, which are advantages of the multi-morph structure.

The present invention has been made in view of the above circumstances, and it is an object of the present invention to reduce, in a piezoelectric element having a multi-morph structure including two or more AlN piezoelectric films doped with impurities, deterioration of crystallinity and piezoelectricity of second and subsequent piezoelectric layers, and to improve sensitivity or driving force as original purposes of the multi-morph structure.

According to one aspect of the present invention, there is provided a piezoelectric element including a substrate, a lower electrode layer on the substrate, an intermediate layer on the lower electrode layer, and an upper electrode layer on the intermediate layer. The intermediate layer includes a first piezoelectric layer including an aluminum nitride as a main component and located between the lower electrode layer and the upper electrode layer, a first buffer layer including an aluminum nitride as a main component and located between the first piezoelectric layer and the upper electrode layer, a first intermediate electrode layer located between the first buffer layer and the upper electrode layer, and a second piezoelectric layer located between the first intermediate electrode layer and the upper electrode layer.

According to the present invention, in a piezoelectric element having a multi-morph structure including two or more AlN piezoelectric films doped with impurities, deterioration of crystallinity and piezoelectricity of second and subsequent piezoelectric layers can be reduced, and sensitivity or driving force as original purposes of the multi-morph structure can be improved.

BRIEF EXPLANATION OF THE DRAWINGS

FIG. 3 is a table illustrating conditions of each experiment performed to verify effects of a piezoelectric element according to one embodiment.

FIG. 4 is a table illustrating results of an experiment performed to verify the effects of the piezoelectric element according to one embodiment.

FIG. 5 is a schematic cross-sectional view of a second embodiment of the vibrating section of the piezoelectric element according to the present invention.

DETAILED DESCRIPTION OF THE INVENTION

Embodiment

1. Structure of Resonator

Figure 1:
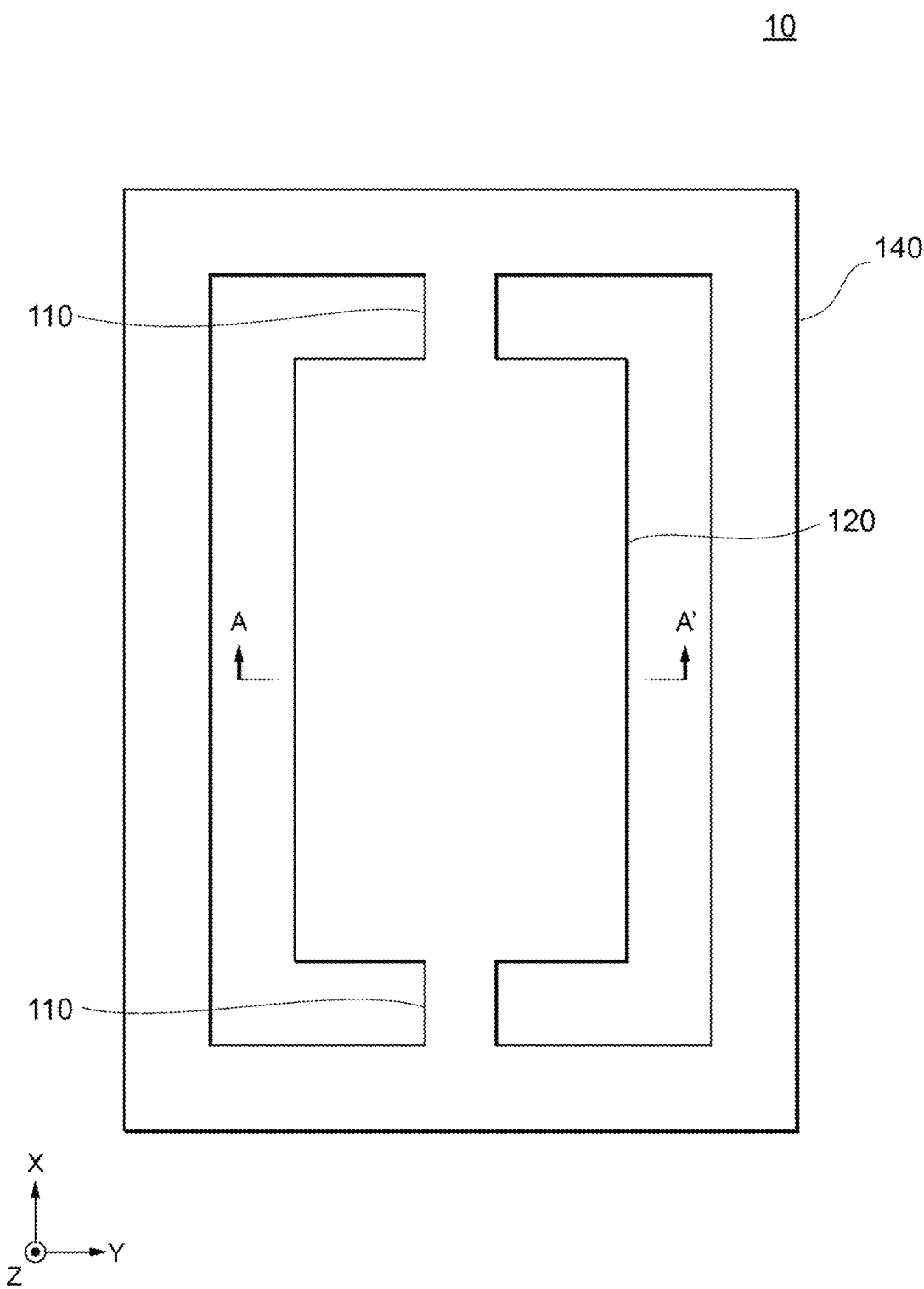
FIG. 1 is a plan view schematically illustrating a structure of a resonator according to one embodiment.

Hereinafter, a first embodiment of the present invention will be described with reference to the accompanying drawings. FIG. 1 is a plan view schematically illustrating an example of a resonator 10 formed using a piezoelectric element according to the first embodiment of the present invention. The resonator 10 is a MEMS vibrator manufactured using MEMS technology, and vibrates in-plane within an XY plane in an orthogonal coordinate system of FIG. 1. It should be noted that one for which the piezoelectric element according to the present invention is used is not limited to the resonator using a thickness spreading vibration mode illustrated in FIG. 1, but may be used in a thickness longitudinal vibration mode, a lamb wave vibration mode, a bending vibration mode, or a surface wave vibration mode. These are applied to timing devices, RF filters, duplexers, and ultrasonic transducers. Further, it may be used for a piezoelectric mirror having an actuator function, a piezoelectric gyro, a piezoelectric microphone having a pressure sensor function, an ultrasonic vibration sensor, or the like.

As illustrated in FIG. 1, the resonator 10 includes a vibrating section 120 (an example of the piezoelectric element), a retaining section 140, and a retaining arm 110.

The vibrating section 120 has a platy contour spreading in a planar shape along the XY plane. The vibrating section 120 is provided inside the retaining section 140, and a space is formed at a predetermined interval between the vibrating section 120 and the retaining section 140.

The retaining section 140 is formed in a rectangular frame shape so as to surround the outside of the vibrating section 120 along the XY plane. For example, the retaining section 140 is integrally formed from a prismatic frame body. Note that the retaining section 140 may be provided in at least a part around the vibrating section 120, and is not limited to a frame shape.

The retaining arm 110 is provided inside the retaining section 140, and connects the vibrating section 120 and the retaining section 140.

2. Stacked Structure of Vibrating Section

Figure 2:
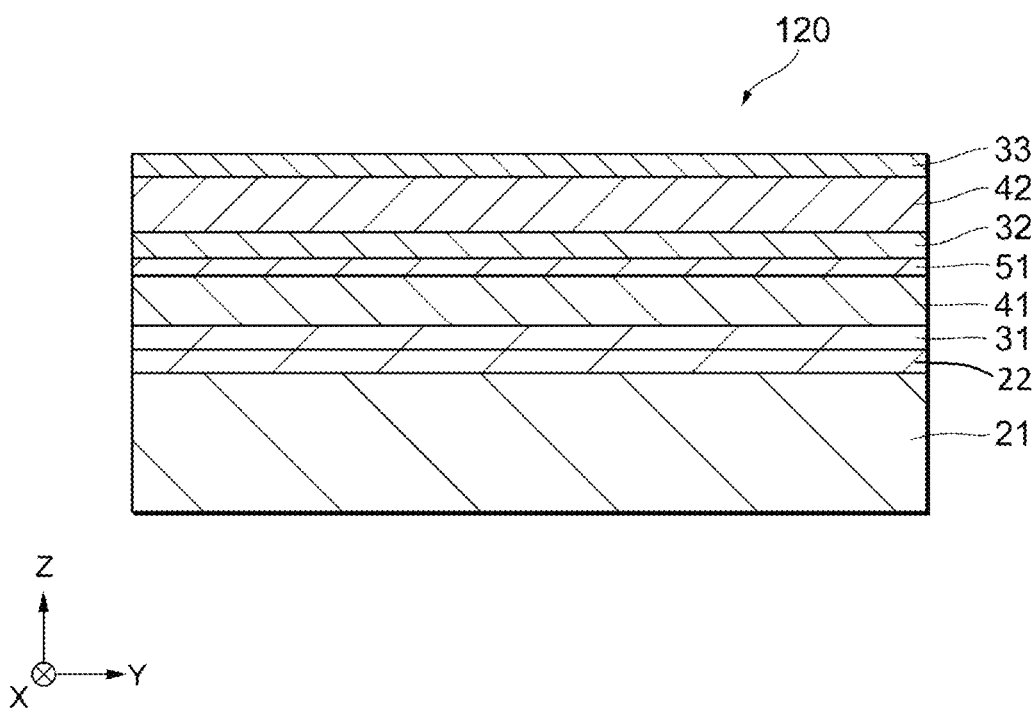
FIG. 2 is a schematic cross-sectional view taken along a line AA' of FIG. 1.

Next, a stacked structure of the vibrating section 120 according to the present embodiment will be described with reference to FIG. 2. FIG. 2 is a cross-sectional view taken along a line AA' of FIG. 1.

In the present embodiment, the vibrating section 120 is formed by stacking a lower electrode layer 31 on a substrate 21 with a Ti layer 22 interposed therebetween. A lower piezoelectric layer (which is an example of a first piezoelectric layer) 41 is stacked on the lower electrode layer 31 so as to cover the lower electrode layer 31, and a buffer layer (which is an example of a first buffer layer) 51 is further stacked on the lower piezoelectric layer 41. An intermediate electrode layer (which is an example of a first intermediate electrode layer) 32 is stacked on the buffer layer 51, an upper piezoelectric layer (which is an example of a second piezoelectric layer) 42 again is stacked on the intermediate electrode layer 32, and an upper electrode layer 33 is stacked on the upper piezoelectric layer 42.

The substrate 21 is formed of, for example, a degenerate n-type Si (silicon) semiconductor having a thickness of about 10 μm. As the n-type dopant, P (phosphorus), As (arsenic), Sb (antimony), or the like can be included. Note that the substrate 21 is preferably a degenerate substrate including Si as a main component, but is not limited thereto. For example, the substrate 21 may be formed of non-degenerate Si, or single crystal such as sapphire, or may be formed of an amorphous material such as glass or Si with an oxide film. Further, after the piezoelectric element is formed, the substrate 21 may be removed by dry etching or the like to form a membrane structure comprised of a stacked body of an electrode and a piezoelectric layer.

The lower electrode layer 31 is formed of, for example, a Ti layer and a metal layer of Mo (molybdenum), Al (aluminum), Ru (ruthenium), Au (gold), W (tungsten), Pt (platinum), or the like. The intermediate electrode layer 32 and the upper electrode layer 33 are formed using, for example, Mo (molybdenum), Al (aluminum), Au (gold), W (tungsten), Pt (platinum), or the like.

The lower piezoelectric layer 41 and the upper piezoelectric layer 42 are thin films of piezoelectric bodies which convert an applied voltage into vibration. The lower piezoelectric layer 41 and the upper piezoelectric layer 42 expand and contract in an in-plane direction on the XY plane according to an electric field applied to the lower piezoelectric layer 41 and the upper piezoelectric layer 42 by the lower electrode layer 31, the intermediate electrode layer 32, and the upper electrode layer 33. Due to the expansion and contraction of the lower piezoelectric layer 41 and the upper piezoelectric layer 42, the vibrating section 120 performs contour vibration in the Y axis direction.

Components of the lower piezoelectric layer 41 and the upper piezoelectric layer 42 will be described. The lower piezoelectric layer 41 and the upper piezoelectric layer 42 are comprised of an AlN (aluminum nitride) crystal having a wurtzite structure. The AlN crystal in the lower piezoelectric layer 41 and the upper piezoelectric layer 42 has a structure which contains Sc (scandium) atoms and in which a part of Al atoms in the AlN crystal are substituted with the Sc atoms. More specifically, in the AlN crystal constituting the lower piezoelectric layer 41 and the upper piezoelectric layer 42, Sc atoms exist at positions of Al atoms. Note that the lower piezoelectric layer 41 and the upper piezoelectric layer 42 may be configured to include Mg and Nb instead of Sc. In this case, Al atoms in the AlN crystal are substituted with Mg or Nb atoms. By substituting Al atoms in the AlN crystal with Sc atoms, Mg atoms, or Nb atoms, piezoelectric characteristics of the lower piezoelectric layer 41 and the upper piezoelectric layer 42 are improved. Further, the lower piezoelectric layer 41 and the upper piezoelectric layer 42 may be configured to include a combination of other elements, for example, Mg and Hf, or Mg and Zr.

In the present embodiment, the ratio of the number of Sc atoms to the total amount of the number of Al atoms and the number of Sc atoms in the lower piezoelectric layer 41 and the upper piezoelectric layer 42 (hereinafter also referred to as "composition ratio of Sc to Al) is greater than 0 at % and 50 at % or less, more preferably 35 at % to 45 at %. In this case, the lower piezoelectric layer 41 and the upper piezoelectric layer 42 can further improve the piezoelectric constant.

The buffer layer 51 is comprised of an AlN crystal having a wurtzite structure. In the buffer layer 51, it is preferable that Sc or the like is not doped into the AlN crystal. By forming the buffer layer 51 between the lower piezoelectric layer 41 and the intermediate electrode layer 32, crystallinity and piezoelectricity of the upper piezoelectric layer 42 can be improved. Specifically, since the piezoelectric element has the buffer layer 51, it is possible to absorb surface roughness of the lower piezoelectric layer 41 and to reduce deterioration of crystallinity of the intermediate electrode layer 32. Thus, it is possible to reduce degradation of crystallinity and deterioration of piezoelectricity of the upper piezoelectric layer 42 formed on the surface of the intermediate electrode layer 32. Further, the buffer layer 51 covers surface contamination of the lower piezoelectric layer 41, more specifically contamination by oxygen or carbon, and hence degradation of crystallinity of the intermediate electrode layer 32 formed thereon can be reduced. Thus, it is possible to reduce degradation of crystallinity and deterioration of piezoelectricity of the upper piezoelectric layer 42 formed on the surface of the intermediate electrode layer 32. Furthermore, a crystal structure distorted by doped elements can be corrected by the buffer layer, and crystallinity deterioration of the intermediate electrode layer 32 formed thereon can be reduced. Thus, it is possible to reduce degradation of crystallinity and deterioration of piezoelectricity of the upper piezoelectric layer 42 formed on the surface of the intermediate electrode layer 32.

Note that although a stacked structure in a bimorph structure is illustrated as an example in FIG. 2, the stacked structure of the piezoelectric element according to the present embodiment is not limited thereto. For example, the stacked structure may be a multi-morph structure further including a piezoelectric layer (which is an example of a third piezoelectric layer), a buffer layer (which is an example of a second buffer layer), and an intermediate electrode layer (which is an example of a second intermediate electrode layer) between the upper piezoelectric layer 42 and the upper electrode layer 33. Note that the multi-morph structure is not limited to a structure in which the number of layers of the piezoelectric layer is three, and may have any number of layers of three or more.

3. Verification Result

Experimental results verifying effects of the piezoelectric element according to the present embodiment will be described with reference to FIGS. 3 and 4. Upon verification, piezoelectric elements were formed for comparative examples and experimental examples, and surface roughness, crystallinity, and piezoelectric characteristics of the formed piezoelectric elements were measured. In forming the lower piezoelectric layer 41, the buffer layer 51, and the upper piezoelectric layer 42, sputtering was performed on the substrate 21 based on an alloy target having a predetermined composition. In this verification, AlN doped with Sc, or Mg and Nb was used for the lower piezoelectric layer 41 and the upper piezoelectric layer 42. Further, AlN was used for the buffer layer 51.

FIG. 3 is a table illustrating conditions of each comparative example and each experimental example. As the upper electrode layer 33 and the intermediate electrode layer 32, Ru (ruthenium) electrodes of 100 nm were used in comparative examples 1 and 2 and experimental examples 1 and 2, and Mo (molybdenum) electrodes of 100 nm were used in experimental examples 3 to 17. As the lower electrode layer 31, in comparative examples 1 and 2 and experimental examples 1 and 2, a Ti layer of 10 nm and an Ru (ruthenium) electrode of 100 nm were used, and in experimental examples 3 to 17, a Ti layer of 10 nm and an Mo (molybdenum) electrode of 100 nm were used.

As the lower piezoelectric layer 41 and the upper piezoelectric layer 42, AlN of 800 nm doped with Mg and Nb was used in comparative example 1 and experimental example 1, and AlN of 800 nm doped with Sc was used in comparative example 2 and experimental examples 2 to 17. Regarding the buffer layer 51, the buffer layer 51 was not formed in comparative examples 1 and 2, and AlN of 2 nm (a film thickness ratio of the buffer layer 51 to a film thickness of the lower piezoelectric layer 41 (hereinafter also simply referred to as "film thickness ratio"): 0.3%) was used in experimental examples 1 to 3, AlN of 5 nm (film thickness ratio: 0.6%) in experimental example 4, AlN of 10 nm (film thickness ratio: 1.3%) in experimental example 5, AlN of 20 nm (film thickness ratio: 2.5%) in experimental example 6, AlN of 50 nm (film thickness ratio: 6.3%) in experimental example 7, AlN of 100 nm (film thickness ratio: 12.5%) in experimental example 8, AlN of 200 nm (film thickness ratio: 25.0%) in experimental example 9, AlN of 250 nm (film thickness ratio: 31.3%) in experimental example 10, AlN of 300 nm (film thickness ratio: 37.5%) in experimental example 11, and AlN of 30 nm (film thickness ratio: 3.8%) in experimental examples 12 to 17.

In forming the buffer layer 51, electric power applied to the target was 1.5 kW in comparative examples 1 and 2 and experimental examples 1 to 12, 1.0 kW in experimental example 13, 0.5 kW in experimental example 14, 0.2 kW in experimental example 15, and 0.1 kW in experimental examples 16 and 17. In this manner, in experimental examples 12 to 16, surface roughness of the buffer layer 51 was varied and verified. Prior to formation of the buffer layer 51, pretreatment by Ar etching was carried out only in experimental example 17 so that oxygen was not contained between the buffer layer 51 and the lower piezoelectric layer 41. In order to prevent oxygen from being contained between the buffer layer 51 and the lower piezoelectric layer 41, it is more effective to form the buffer layer 51 and the lower piezoelectric layer 41 by a vacuum integrated process.

In the piezoelectric element formed under the above conditions, arithmetic mean roughness (Ra) [nm] of a surface of the intermediate electrode layer 32 and crystallinity (XRD intensity) [cps] and piezoelectric characteristics (piezoelectric constant $d_{33,f}$) [pm/V] of the lower piezoelectric layer 41, the upper piezoelectric layer 42, and the intermediate electrode layer 32 were measured. The arithmetic mean roughness of the surface of the intermediate electrode layer 32 was measured by an atomic force microscope (AFM) after forming the intermediate electrode layer 32 and extracting a part thereof. The crystallinity of the lower piezoelectric layer 41 was performed by X-ray diffraction measurement after forming the lower piezoelectric layer 41. Similarly, the crystallinity of the intermediate electrode layer 32 was performed by X-ray diffraction measurement after forming the intermediate electrode layer 32 and the crystallinity of the upper piezoelectric layer 42 was performed by X-ray diffraction measurement after forming the upper piezoelectric layer 42. Since the crystallinity of the upper piezoelectric layer 42 is influenced by the lower layer (the portion up to the intermediate electrode layer 32), the verification was performed with values obtained by subtracting the crystallinity of the lower layer. Further, the piezoelectric characteristics were verified by measuring piezoelectric constants $d_{33,f}$ using aixDBLI research line (TF Analyzer 2000e) manufactured by AIX-ACCT Systems GmbH after forming the piezoelectric element.

FIG. 4 is a table illustrating verification results. Comparing the results of experimental example 1 (with buffer layer 51) with those of comparative example 1 (without buffer layer 51), it can be seen that the piezoelectric element of experimental example 1 has higher crystallinity in each layer and also has higher piezoelectric constant. Comparing the results of comparative example 1 and experimental example 1 with those of comparative example 2 and experimental example 2, it can be seen that this effect is higher when ScAlN was used for the lower piezoelectric layer 41 and the upper piezoelectric layer 42. Further, when comparing the results of comparative examples 1 and 2 and experimental examples 1 and 2 with those of experimental example 3, it can be seen that use of Mo is preferable as the lower electrode layer 31, the intermediate electrode layer 32, and the upper electrode layer 33.

Next, referring to the results of experimental examples 4 to 11 in which the verification was performed while varying the film thickness ratios from about 0.5% to about 40%, the piezoelectric characteristics gradually improve in experimental examples 4 to 9 in which the film thickness ratio was in the range of 0.5% to about 30%, whereas the piezoelectric characteristics starts to deteriorate in the experimental examples 10 and 11 in which the film thickness ratio exceeds 30%. It can be seen from this result that the film thickness ratio is preferably about 0.5% to about 30%. This is because the proportion of the buffer layer 51 having a low piezoelectricity was larger than that of the lower piezoelectric layer and the upper piezoelectric layer.

Next, referring to the results of experimental examples 12 to 16 in which the verification was performed while varying surface roughness of the intermediate electrode layer 32, in experimental examples 14 to 16 in which the arithmetic mean roughness of the surface was 2.0 nm or less, the crystallinity of the upper piezoelectric layer 42 and the intermediate electrode layer 32 is remarkably improved. It can be seen from this result that the arithmetic mean roughness of the surface of the intermediate electrode layer 32 is preferably 2.0 nm or less.

Furthermore, referring to the results of experimental example 16 (with oxygen) and experimental example 17 (without oxygen) in which the effect due to the presence or absence of oxygen between the buffer layer 51 and the lower piezoelectric layer 41 was verified, the crystallinity and the piezoelectric characteristics of the intermediate electrode layer 32 and the upper piezoelectric layer 42 are further improved in the case without oxygen. It can be seen from this result that absence of oxygen is preferable between the buffer layer 51 and the lower piezoelectric layer 41.

In the foregoing, an exemplary embodiment of the present invention has been described. A piezoelectric element according to one embodiment of the present invention includes a substrate 21, a lower electrode layer 31 formed on the substrate 21, an intermediate layer formed on the lower electrode layer 31, and an upper electrode layer 33 formed on the intermediate layer, in which the intermediate layer includes a lower piezoelectric layer 41 including an aluminum nitride as a main component and formed between the lower electrode layer 31 and the upper electrode layer 33, a buffer layer 51 including an aluminum nitride as a main component and formed between the lower piezoelectric layer 41 and the upper electrode layer 33, an intermediate electrode layer 32 formed between the buffer layer 51 and the upper electrode layer 33, and an upper piezoelectric layer 42 formed between the intermediate electrode layer 32 and the upper electrode layer 33. Since the piezoelectric element has the buffer layer 51, surface roughness of the lower piezoelectric layer 41 can be absorbed, and deterioration of crystallinity of the intermediate electrode layer 32 can be reduced. Thus, it is possible to reduce degradation of crystallinity and deterioration of piezoelectricity of the upper piezoelectric layer 42 formed on the surface of the intermediate electrode layer 32.

Preferably, an aluminum nitride crystal constituting the lower piezoelectric layer 41 and the upper piezoelectric layer 42 has a structure which includes scandium atoms, and in the structure a part of aluminum atoms in the aluminum nitride crystal are substituted with the scandium atoms. In this preferred embodiment, the piezoelectric characteristics of the lower piezoelectric layer 41 and the upper piezoelectric layer 42 can be improved.

Preferably, the lower electrode layer 31, the intermediate electrode layer 32, or the upper electrode layer 33 includes molybdenum as a main component. In this preferred embodiment, the effect of reducing deterioration of crystallinity and lowering of piezoelectricity of the upper piezoelectric layer 42 formed on the surface of the intermediate electrode layer 32 can be improved.

Preferably, a ratio of a film thickness of the buffer layer 51 to a film thickness of the lower piezoelectric layer 41 is 0.5% to 30%. Also preferably, oxygen is absent between the buffer layer 51 and the lower piezoelectric layer 41. Also preferably, an arithmetic mean roughness of a surface of the intermediate electrode layer 32 is 2.0 nm or less. In this preferred embodiment, the effect of reducing deterioration of crystallinity and lowering of piezoelectricity of the upper piezoelectric layer 42 formed on the surface of the intermediate electrode layer 32 can be improved.

Preferably, and as shown for example in FIG. 5, the intermediate layer has another buffer layer 51' including an aluminum nitride as a main component and formed between the upper piezoelectric layer 42 and the upper electrode layer 33, another intermediate electrode layer 32' formed between the other buffer layer 51' and the upper electrode layer 33, and another piezoelectric layer 42' formed between the other intermediate electrode layer 32' and the upper electrode layer 33. In this preferred embodiment, deterioration of crystallinity and lowering of piezoelectricity of the upper piezoelectric layer 42 formed on the surface of the intermediate electrode layer 32 can be reduced also in the multi-morph structure. Further preferably, the buffer layer 51 and the other buffer layers 51' are comprised of an aluminum nitride that is non-doped (a non-doped aluminum nitride).

It should be noted that each of the above-described embodiments is intended to facilitate understanding of the present invention and is not intended to be construed as limiting the present invention. The present invention can be modified/improved without departing from the spirit of the invention, and equivalents thereof are also included in the present invention. That is, those in which design modifications are appropriately made to each embodiment by those skilled in the art are also included in the scope of the present invention as long as they have the features of the present invention. For example, the elements included in each embodiment and arrangements, materials, conditions, shapes, sizes, and so on thereof are not limited to those exemplified and can be appropriately changed. Also, it is needless to mention that each embodiment is illustrative and partial substitutions or combinations of configurations illustrated in different embodiments are possible, and such partial substitutions or combinations are also included in the scope of the present invention as long as they include features of the present invention.

DESCRIPTION OF REFERENCE SYMBOLS

10: resonator
21: substrate
22: layer
31: lower electrode layer
32: intermediate electrode layer
33: upper electrode layer
41: lower piezoelectric layer
42: upper piezoelectric layer
51: buffer layer
110: retaining arm
120: vibrating section
140: retaining section

The invention claimed is:
1. A piezoelectric element comprising:
a substrate;
a lower electrode layer on the substrate;
an intermediate layer on the lower electrode layer; and
an upper electrode layer on the intermediate layer,
wherein the intermediate layer includes:
    a first piezoelectric layer doped with impurities and located between the lower electrode layer and the upper electrode layer;
    a first buffer layer comprised of an aluminum nitride and located between the first piezoelectric layer and the upper electrode layer;
    a first intermediate electrode layer between the first buffer layer and the upper electrode layer; and
    a second piezoelectric layer doped with impurities and located between the first intermediate electrode layer and the upper electrode layer, wherein the first buffer layer is between and in direct contact with both the first piezoelectric layer and the first intermediate electrode layer.

2. The piezoelectric element according to claim 1, wherein the first piezoelectric layer and the second piezoelectric layer are comprised of an aluminum nitride crystal having a structure which includes scandium atoms, and in the structure a part of aluminum atoms in the aluminum nitride crystal are substituted with the scandium atoms.

3. The piezoelectric element according to claim 1, wherein a ratio of a number of the scandium atoms to a total amount of a number of the aluminum atoms and the number of scandium atoms in the first piezoelectric layer and the second piezoelectric layer is greater than 0 at % and 50 at % or less.

4. The piezoelectric element according to claim 1, wherein a ratio of a number of the scandium atoms to a total amount of a number of the aluminum atoms and the number of scandium atoms in the first piezoelectric layer and the second piezoelectric layer is 35 at % to 45 at %.

5. The piezoelectric element according to claim 1, wherein the first piezoelectric layer and the second piezoelectric layer are comprised of an aluminum nitride crystal having a structure which includes Sc, Mg or Nb atoms, and in the structure a part of aluminum atoms in the aluminum nitride crystal are substituted with the Sc, Mg or Nb atoms.

6. The piezoelectric element according to claim 1, wherein the lower electrode layer, the first intermediate electrode layer, or the upper electrode layer include molybdenum as a main component thereof.

7. The piezoelectric element according to claim 1, wherein the lower electrode layer includes a Ti layer and a metal layer of molybdenum.

8. The piezoelectric element according to claim 1, wherein the lower electrode layer includes molybdenum, aluminum, ruthenium, gold, tungsten, or platinum as a main component thereof, and wherein the first intermediate electrode layer or the upper electrode layer includes molybdenum, aluminum, gold, tungsten, or platinum as a main component thereof.

9. The piezoelectric element according to claim 1, wherein oxygen is absent between the first buffer layer and the first piezoelectric layer.

10. The piezoelectric element according to claim 1, wherein an arithmetic mean roughness of a surface of the first intermediate electrode layer is 2.0 nm or less.

11. The piezoelectric element according to claim 1, wherein the first buffer layer is comprised of a non-doped aluminum nitride.

12. A piezoelectric element comprising:
a substrate;
a lower electrode layer on the substrate;
an intermediate layer on the lower electrode layer; and
an upper electrode layer on the intermediate layer,
wherein the intermediate layer includes:
   a first piezoelectric layer doped with impurities and located between the lower electrode layer and the upper electrode layer;
   a first buffer layer comprised of an aluminum nitride and located between the first piezoelectric layer and the upper electrode layer;
   a first intermediate electrode layer between the first buffer layer and the upper electrode layer; and
   a second piezoelectric layer doped with impurities and located between the first intermediate electrode layer and the upper electrode layer,
   wherein a ratio of a first film thickness of the first buffer layer to a second film thickness of the first piezoelectric layer is 0.5% to 30%.

13. A piezoelectric element comprising:
a substrate;
a lower electrode layer on the substrate;
an intermediate layer on the lower electrode layer; and
an upper electrode layer on the intermediate layer,
wherein the intermediate layer includes:
   a first piezoelectric layer doped with impurities and located between the lower electrode layer and the upper electrode layer;
   a first buffer layer comprised of an aluminum nitride and located between the first piezoelectric layer and the upper electrode layer;
   a first intermediate electrode layer between the first buffer layer and the upper electrode layer;
   a second piezoelectric layer doped with impurities and located between the first intermediate electrode layer and the upper electrode layer;
   a second buffer layer comprised of an aluminum nitride and located between the second piezoelectric layer and the upper electrode layer;
   a second intermediate electrode layer between the second buffer layer and the upper electrode layer; and
   a third piezoelectric layer formed the second intermediate electrode layer and the upper electrode layer.

14. The piezoelectric element according to claim 13, wherein the second buffer layer is comprised of a non-doped aluminum nitride.

15. The piezoelectric element according to claim 13, wherein the first piezoelectric layer, the second piezoelectric layer, and the third piezoelectric layer are comprised of an aluminum nitride crystal having a structure which includes scandium atoms, and in the structure a part of aluminum atoms in the aluminum nitride crystal are substituted with the scandium atoms.

16. The piezoelectric element according to claim 13, wherein a ratio of a number of the scandium atoms to a total amount of a number of the aluminum atoms and the number of scandium atoms in the first piezoelectric layer, the second piezoelectric layer, and the third piezoelectric layer is greater than 0 at % and 50 at % or less.

17. The piezoelectric element according to claim 13, wherein the lower electrode layer, the first intermediate electrode layer, the second intermediate electrode layer, or the upper electrode layer include molybdenum as a main component thereof.

18. The piezoelectric element according to claim 13, wherein the lower electrode layer includes a Ti layer and a metal layer of molybdenum.

19. The piezoelectric element according to claim 13, wherein an arithmetic mean roughness of a first surface of the first intermediate electrode layer and a second surface the second intermediate electrode layer are each 2.0 nm or less.

20. The piezoelectric element according to claim 13, wherein the first buffer layer and the second buffer layer are comprised of a non-doped aluminum nitride.

* * * * *